United States Patent [19]
Gris et al.

[11] Patent Number: 6,165,265
[45] Date of Patent: Dec. 26, 2000

[54] METHOD OF DEPOSITION OF A SINGLE-CRYSTAL SILICON REGION

[75] Inventors: Yvon Gris, Tullins; Germaine Troillard, Le Touvet; Jocelyne Mourier, Saint Egreve, all of France

[73] Assignee: STMicroelectronics S.A., Gentilly, France

[21] Appl. No.: 09/237,378

[22] Filed: Jan. 26, 1999

[30] Foreign Application Priority Data

Jan. 30, 1998 [FR] France .................... 98 01313

[51] Int. Cl.[7] ............ C30B 25/16; C30B 29/06
[52] U.S. Cl. ............ 117/106; 117/913; 117/935
[58] Field of Search ............... 117/2, 84, 94, 117/101, 106, 108, 913, 935

[56] References Cited

U.S. PATENT DOCUMENTS

| | | | |
|---|---|---|---|
| 5,010,034 | 4/1991 | Manoliu | 438/207 |
| 5,554,561 | 9/1996 | Plumton | 438/193 |

FOREIGN PATENT DOCUMENTS

| | | |
|---|---|---|
| 0746032 A2 | 12/1996 | European Pat. Off. . |
| 0813232 A2 | 12/1996 | European Pat. Off. . |
| 58-131748 | 8/1983 | Japan . |
| 1-223765 | 9/1989 | Japan . |
| 7-176742 | 7/1995 | Japan . |

OTHER PUBLICATIONS

Search Report for (French) Appl. FR 9,801,313, Oct. 1998.

Garverick, L.M. et al., "Silicon surface cleaning by low dose argon–ion bombardment for low temperature (750 C) epitaxial deposition. II. Epitaxial quality", Journal of Applied Physics, vol. 62, No. 8: 3398–3404., Oct. 1987.

*Primary Examiner*—Benjamin L. Utech
*Assistant Examiner*—Donald L. Champagne
*Attorney, Agent, or Firm*—Wolf, Greenfield & Sacks, P.C.; James H. Morris; Theodore E. Galanthay

[57] ABSTRACT

The present invention relates to a method of deposition of a silicon layer on a single-crystal silicon substrate 11, so that the silicon layer is a single-crystal layer, but of different orientation than the substrate, including the steps of defining a window 13 on the substrate; creating inside the window interstitial defects 14 with an atomic proportion lower than one for one hundred; and performing a silicon deposition 15 in conditions generally corresponding to those of an epitaxial deposition, but at a temperature lower than 750° C.

10 Claims, 4 Drawing Sheets

METHOD OF DEPOSITION OF A SINGLE-CRYSTAL SILICON REGION

BACKGROUND OF THE INVENTION

1. Field of the Invention

The present invention generally relates to the manufacturing of semiconductor devices.

2. Discussion of the Related Art

In many semiconductor component manufacturing processes, silicon has to be deposited on a single-crystal silicon substrate, or on an area of this substrate. Several techniques are currently used.

A first, so-called epitaxial, type of deposition is performed under a reducing atmosphere and enables the crystal structure of the deposited layer to be in crystalline continuity with the substrate. These techniques require a deposition at high temperature, typically ranging between 1000° C. and 1200° C. for a deposition under atmospheric pressure and between 900° C. and 1100° C. under reduced pressure. The reducing atmosphere is obtained by using a mixture of reactive gases in hydrogen ($H_2$).

Techniques, such as chemical vapor deposition (CVD), which enable silicon depositions at low temperature (500° C. to 700° C.) are also known. With these techniques, the deposited silicon is polycrystalline, or amorphous. More precisely, the size of the polysilicon grains decreases with temperature. At low pressure and at 550° C., the deposited silicon is amorphous.

In many cases, at the end of the manufacturing process of an integrated circuit, silicon is desired to be deposited on a portion of a single-crystal silicon substrate to form either a substrate doping source, or a contacting area between an underlying layer and the external environment, or to simultaneously ensure both functions. It is then essential that the temperatures involved do not exceed a value on the order of 600° C. to avoid undesirable dopant diffusions.

SUMMARY OF THE INVENTION

An object of the present invention is to provide a method of deposition at low temperature (lower than 750° C.) of silicon on a single-crystal silicon substrate, such that the deposited silicon has a single-crystal structure.

Another object of the present invention is to provide a method of low temperature deposition of silicon on a single-crystal silicon substrate, such that the deposited silicon has a single-crystal structure with crystallographic axes distinct from those of the substrate.

Another object of the present invention is to provide a specific application of this method to the manufacturing of emitters of bipolar transistors.

To achieve these and other objects, the present invention provides a method of deposition of a silicon layer on a single-crystal silicon substrate, so that the silicon layer is a single-crystal layer, but of different orientation than the substrate, including the steps of defining a window on the substrate; creating inside the window interstitial defects with an atomic proportion lower than one for one hundred; and performing a silicon deposition in conditions generally corresponding to those of an epitaxial deposition, but at a temperature lower than 900° C.

According to an embodiment of the present invention, the deposition temperature ranges between 600° C. and 700° C.

According to an embodiment of the present invention, the step of defect creation includes an implantation step.

According to an embodiment of the present invention, the implantation is performed through a silicon oxide layer of a thickness lower than 10 nm and this implantation is followed by a step of removal of the silicon oxide layer.

According to an embodiment of the present invention, the implantation is an implantation of an electrically neutral element.

According to an embodiment of the present invention, the implantation is an implantation of an element chosen from the group containing fluorine, silicon, germanium, boron, indium, phosphorus, arsenic, and antimony.

According to an embodiment of the present invention, the implantation of an electrically neutral element is a fluorine implantation at 12 keV, at $10^{13}$ at./cm$^2$.

According to an embodiment of the present invention, the window opening is reduced to a width lower than 5 μm, preferably, on the order of 0.35 μm.

According to an embodiment of the present invention, the reduction of the width of the window opening is performed by compound spacers.

According to an embodiment of the present invention, the compound spacers are formed of silicon nitride regions, and of polysilicon spacers.

The foregoing objects, features and advantages of the present invention, will be discussed in detail in the following non-limiting description of specific embodiments in connection with the accompanying drawings.

DETAILED DESCRIPTION

Figure 1A:
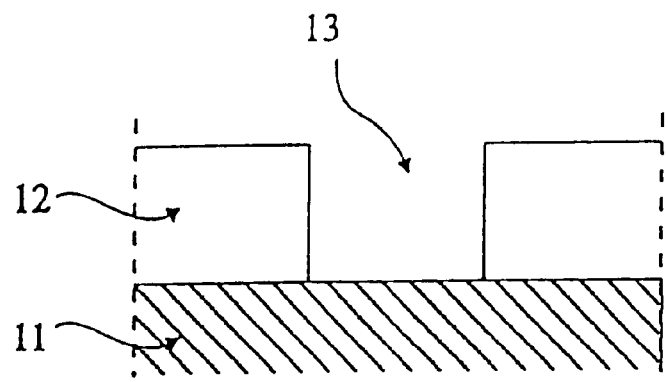
FIGS. 1A, 1B, and 1C schematically illustrate successive steps of a method according to the present invention.

FIG. 1A shows a single-crystal silicon substrate 11, above which is formed a layer 12 provided with a window 13, of a width lower than 5 μm and, preferably, lower than 1 μm. The aim of the present invention is to develop a single-crystal silicon area extending from the surface of substrate 11 apparent in opening 13.

Figure 1B:
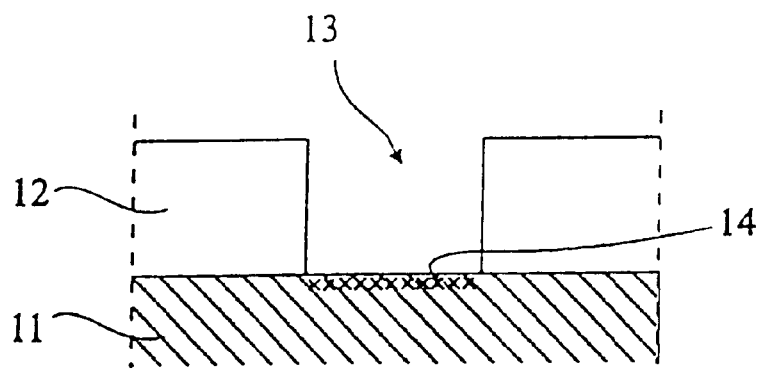

As shown in FIG. 1B, the surface of the region of layer 11 uncovered by window 13 is processed to create, in uncovered region 14, interstitial defects in the crystal lattice which is thus slightly locally deformed. The processing is applied to create defects with a proportion of about one atom for one hundred, down to a depth lower than 5 nm. Such a dose is too low to amorphize the silicon which remains single-crystal silicon. In particular, any plasma or RIE-type etching, in which ions are directed to the surface to create an anisotropic chemical etch, may be used. Any voluntary implantation of ions or neutral atoms will mechanically create interstitial defects. According to the present invention, these defects should, preferably, be located at the surface. For this reason, it is now preferred to use charged particles rather than neutral atoms. The implanters used in microelectronics are preferentially used since they enable a perfect control of the flow and energy of the implanted ions. According to the valence of the implanted atom, in addition to the mechanical effect, creation of interstitial defects, a second electric effect will occur when the added atom will substitute to an existing silicon atom. In practice, boron ($^{11}$B) and indium ($^{114}$In) implantations will be performed to provide a P-type doping, phosphorus ($^{31}$P), arsenic ($^{75}$As), or antimony ($^{122}$Sb) implantations will be performed to provide an N-type doping, or silicon ($^{28}$Si), germanium ($^{73}$Ge), or fluorine ($^{19}$F) implantations will be performed to remain electrically neutral. Any other massive atom may be used.

Figure 1C:
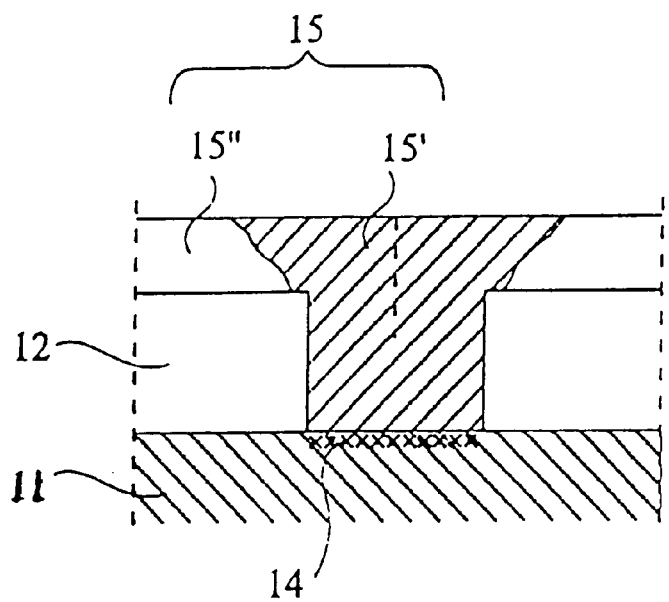

As shown in FIG. 1C, immediately after this processing, and without providing any anneal step, an upper layer 15 is deposited in conditions close to those of an epitaxial deposition, that is, under a reducing atmosphere but at a temperature lower than the temperature generally used in an epitaxial deposition. The temperature of the deposition according to the present invention typically is in a range between 600 and 700° C., for example, 630° C. under a reduced pressure of about $0.1.10^5$ Pa (80 torr), the reactive gas being silane (SiH$_4$).

In the window opening and substantially vertically thereabove, layer 15, designated by reference 15', hatched in FIG. 1C, takes a single-crystal structure, like substrate 11, but along different crystallographic axes than those of substrate 11. Outside the window, substantially above layer 12, layer 15, designated by reference 15", conventionally takes a polycrystal, or possibly amorphous, structure.

The contacting of an area of a single-crystal substrate 11 with a single-crystal silicon region 15' having different crystallographic axes than substrate 11 is thus obtained.

Figure 2A:
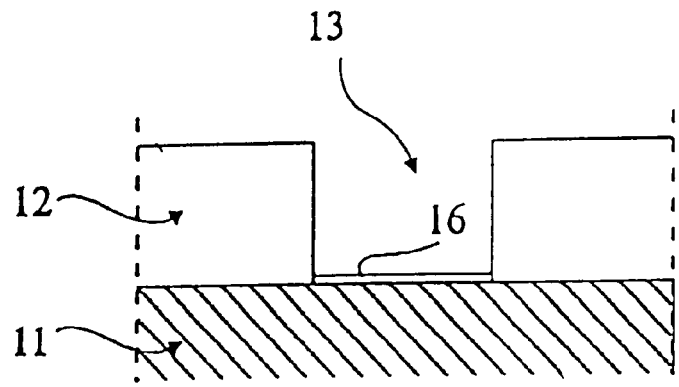
FIGS. 2A, 2B, and 2C illustrate an embodiment of some steps of the method according to the present invention.
Figure 2B:
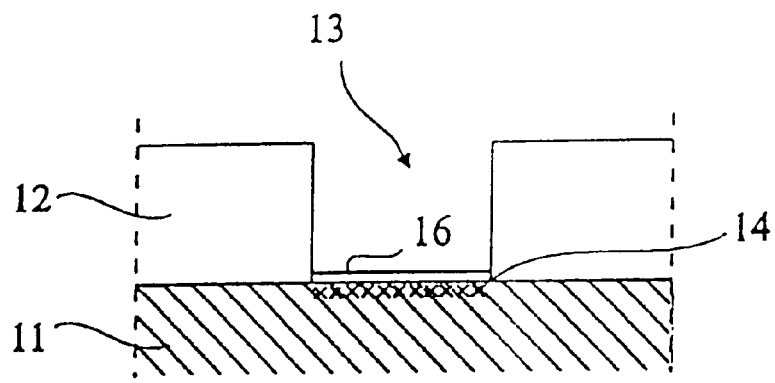
Figure 2C:
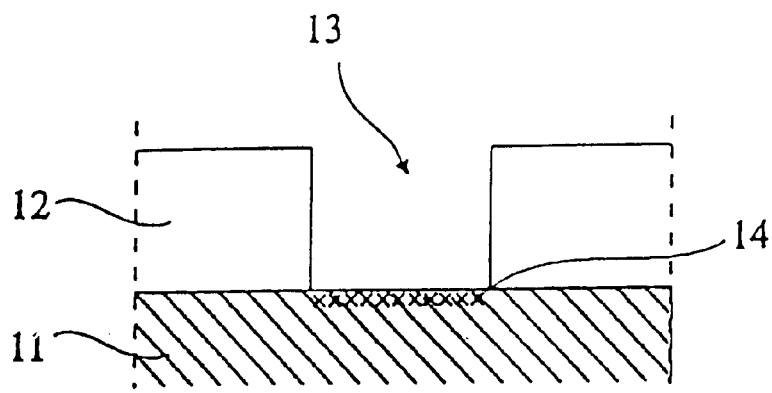

FIGS. 2A to 2C illustrate a specific embodiment of the interstitial defects creation processing. A layer 12 provided with a window 13 is formed above an initial single-crystal silicon substrate 11. The apparent surface of substrate 11 in window 13 is covered with a silicon oxide layer 16. Silicon oxide layer 16, which is very thin, of a thickness below 10 nm, is either a native oxide, or a voluntarily formed thermal oxide layer. This sacrificial oxide layer has an important function of cleaning and reorganizing the single-crystal silicon surface.

As illustrated in FIG. 2B, a low dose implantation 14 is then performed through oxide layer 16. Outside the window, this implantation is masked by layer 12.

At the following step shown in FIG. 2C, oxide layer 16 is removed by wet etching. The substrate structure then is identical to that already described in relation with FIG. 1B.

Then, without performing any previous anneal, the silicon deposition according to the present invention is performed. The direct contacting of an area of a single-crystal substrate 11 with a single-crystal silicon region 15' of different crystallographic axes than substrate 11 is thus obtained, as previously described in relation with FIG. 1C.

Implanted body 14 is characterized by its mass, its energy, and possibly its electric effect. The implantation is performed at low energy and low concentration, to create a defect density, for example, on the order of $10^{19}$ at./cm$^3$ down to a depth on the order of 10 nm. As an example, the applicant has successfully performed silicon, fluorine, and boron ($^{11}$B) implantations. For example, a fluorine implantation has been performed through a 5-nm oxide layer, under a 10-keV energy, and at a density of $4.10^{12}$ at./cm$^2$.

Layer 12 shown in FIGS. 1A to 1C and 2A to 2C may be formed of any material currently used in the field of integrated circuit manufacturing, for example, silicon oxide (SiO$_2$) or silicon nitride (Si$_3$N$_4$). It could also be a stacking of layers including, for example, one or several insulating layers and, possibly, one or several conductive layers.

As an example only, and without this forming a limitation of the present invention, for which those skilled in the art may provide many other applications, a specific application of the present invention to the formation of a bipolar transistor emitter will be described hereafter.

FIGS. 3A to 3D illustrate steps of formation of an NPN-type bipolar transistor emitter in a submicronic BIC-MOS technology developed by the applicant.

Figure 3A:
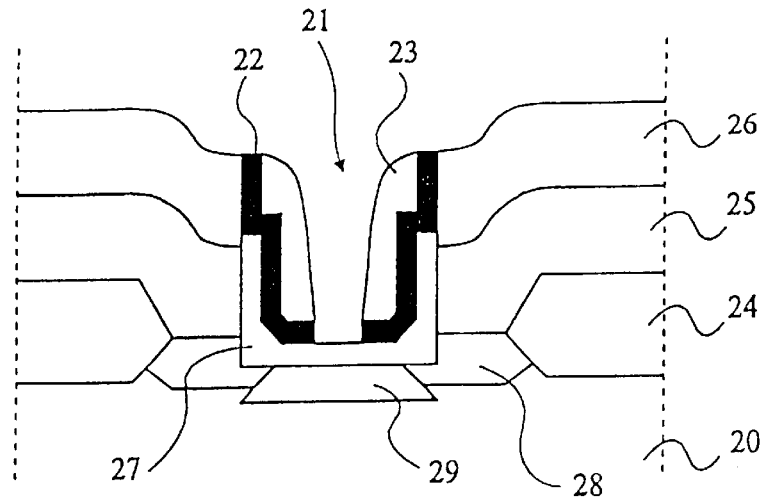
FIGS. 3A, 3B, 3C and 3D show an example of application of the method according to the present invention to the formation of a bipolar transistor emitter.

FIG. 3A shows a bipolar transistor before the formation of the emitter, such as described in U.S. patent application Ser. No. 08/968,598, now U.S. Pat. No. 5,953,600, which application is incorporated herein by reference. Before the emitter is formed, the structure includes, in particular:

an N-type epitaxial layer 20;

a thick oxide layer 24 defining a base area;

a P-type, for example, boron-doped polysilicon base contact area 25; and an encapsulation oxide layer 26.

An opening 21 is formed in layers 25 and 26 substantially at the center of the window defined by thick oxide 24.

A thermal oxide 27 covers the lateral wall of polysilicon 25 and the silicon bottom 28 of opening 21. An extrinsic base region 28 having for example a junction depth on the order of 100 nm results from a diffusion of the dopant (for example, boron) contained in polysilicon layer 25. An intrinsic base region 29 results from an implantation (for example, of type P) delimited by opening 21. This intrinsic base is preferably boron implanted at low energy (for example, $2.10^{13}$ atoms/cm$^2$ under 5 keV).

Then, the lateral walls of the opening have been provided with compound spacers formed of silicon nitride regions 22, and of polysilicon spacers 23. Nitride 22 and spacers 23 thus altogether define a smaller opening than the opening initially formed in layers 25 and 26 for the definition of intrinsic base 28. This smaller opening is the emitter opening and has a width lower than 5 $\mu$m, preferably on the order of 0.35 $\mu$m. Preferably, spacers 23 result from a reactive ionic etching of polysilicon and the opening in the bottom of nitride layer 22 results from a wet chemical etching. As a result, the surface of base region 29 is free of defects which could result from a plasma etching of layer 23.

From this structure, an emitter contact region which could also be used as an emitter doping source is desired to be formed by diffusion in underlying intrinsic base region 29. In the above-mentioned patent application, this is done by polysilicon CVD.

Figure 3B:
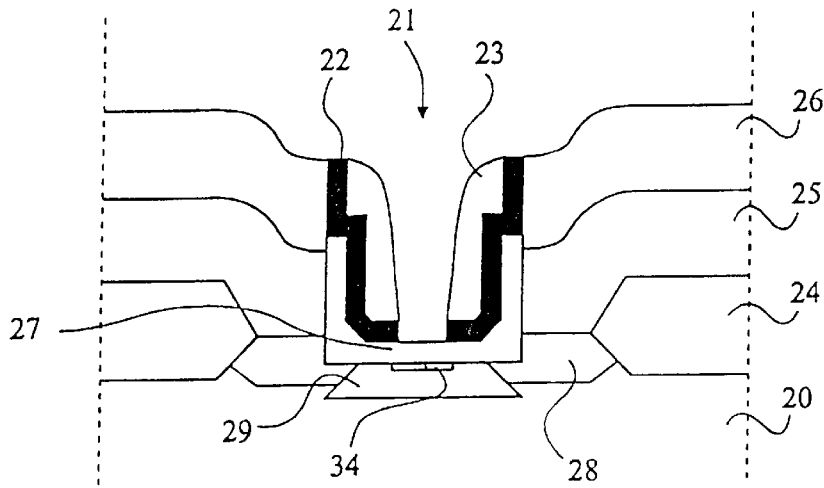

According to the present invention, as illustrated in FIG. 3B, an implantation 34 is performed through oxide layer 27 at the surface of intrinsic base region 29. Implantation 34 is performed to create interstitial defects, preferably, down to a depth on the order of 10 nm, with an electrically neutral body, in order not to alter the doping of the thin intrinsic base, for example, fluoride, at 12 keV, at $10^{13}$ at./cm$^2$, through a 5-nm oxide layer.

Figure 3C:
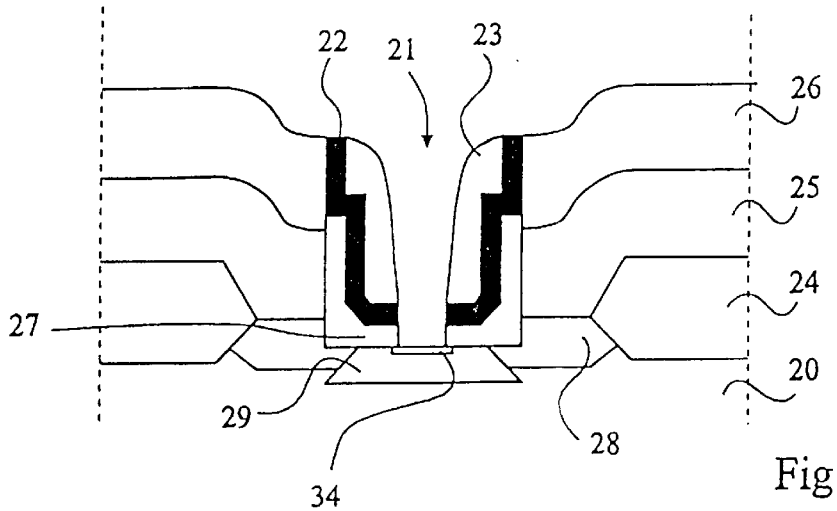

At the following step, shown in FIG. 3C, without any intermediary anneal step, the region of oxide layer 27 which is apparent at the bottom of the opening is carefully cleaned, for example in a diluted hydrofluoric acid bath.

Figure 3D:
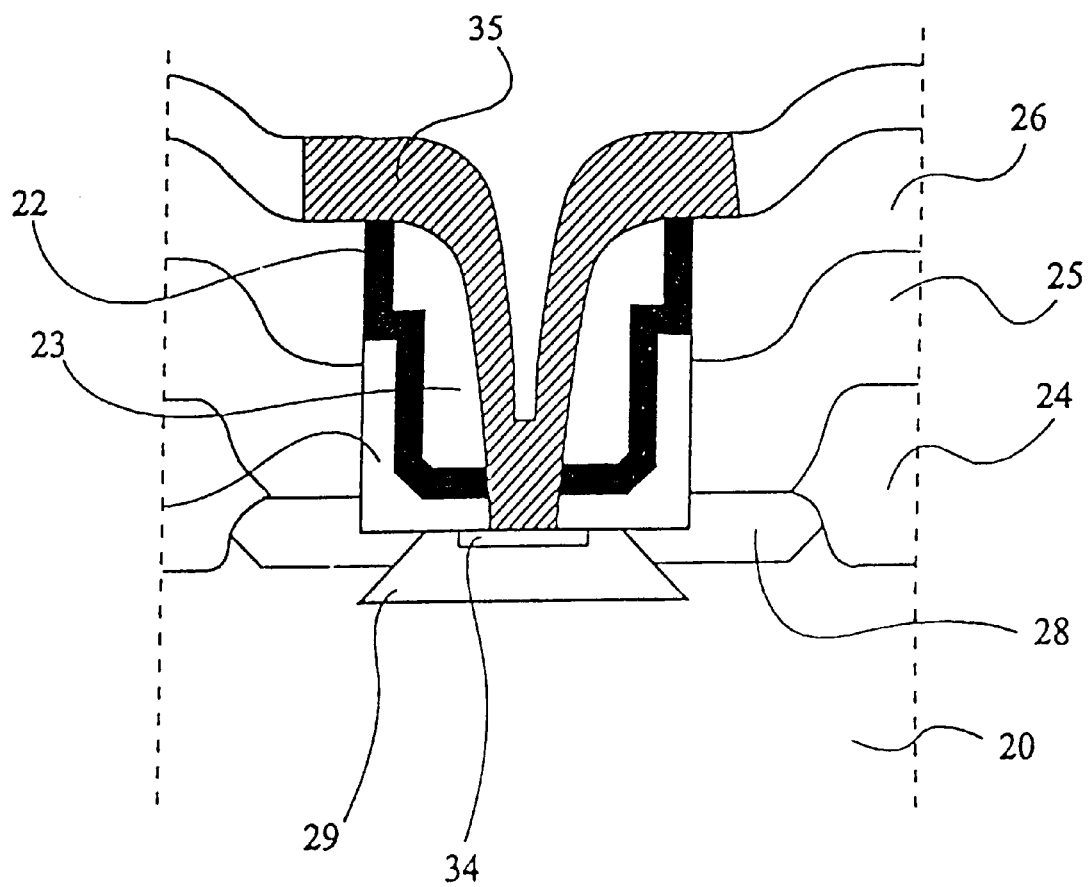

At the following step, shown in FIG. 3D, a silicon layer 35 is deposited according to the present invention. This deposition is performed in the conditions generally used for an epitaxial deposition in a reducing atmosphere, for example, from a mixture of hydrogen and silane (SiH$_4$), but at a temperature on the order of 650° C., and thus lower than the usual temperature of an epitaxy. Layer 35 thus formed will exhibit in the opening, and substantially vertically thereabove, a single-crystal structure, but having different axes than the single-crystal structure of intrinsic base 29.

Further, since the deposition is performed in an epitaxy reactor, a high doping (for example, of type N) of this layer 35 (for example, from arsine AsH$_3$) can be simultaneously performed.

The application of the method according to the present invention results in a single-crystal emitter contact layer 35 on a single-crystal base layer. The interface between these layers of different crystallographic axes thus exhibits a single grain boundary.

Measurements performed by transmission microscopy that enable visualization of the atoms, and thus, the crystal structure, have shown that the area disturbed at the level of the grain boundary extends over a thickness of less than 3 to 5 atomic layers.

An advantage of the present invention is that a single-crystal emitter is perfectly reproducible and has well determined characteristics, contrary to a conventional polycrystal emitter. Indeed, two polycrystal structures never are perfectly identical, which results in variations of operating characteristics from one transistor to another.

In the presence of a conventional incoherent interface between a single-crystal base region and a polycrystal emitter contact layer, a "dopant pumping", that is, an undesirable local concentration of the dopants of the underlying layer, appears and modifies the doping of the base region. The coherent interface of the method according to the present invention eliminates this problem.

Prior incoherent interfaces used to generate random noise due to the uncontrollability of the structure of the associated incoherent grain boundaries. This noise no longer appears in the case of the coherent interface of the method according to the present invention.

In a conventional emitter, that is, a polycrystal emitter, recombinations of minority carriers (holes, in the case of an NPN transistor) which decrease the gain of the device occur, upon operation of the transistor comprising this emitter. Such recombinations are no longer possible, or are reduced, in the case of the single-crystal emitter according to the present invention in which the recombinations are located at the level of the grain boundary and of the metallization formed on the emitter contact recovery single-crystal silicon layer. As a result, the base current characteristics according to the present invention are improved, and thus the gain of the associated transistor is increased.

Incoherent interfaces used to increase the emitter resistance, which would reduce the maximum possible current in the associated transistor and create parasitic passive elements.

Another advantage of the present invention is to make the base current relatively insensitive to the surface of the emitter-base interface and relatively insensitive to the emitter volume, the only element recombining minority carriers in this volume being the majority carriers and no longer the grain boundaries. Thus, according to the doping conditions, the base current will mainly depend on the only remaining recombining element: the surface of the metal contact.

Another advantage of the present invention is that the current injected by the emitter always is proportional to the emitter. Accordingly, the gain of the associated transistor can be adjusted according to the ratio between the contact surface and the emitter-base surface.

The present invention is likely to have various alterations, modifications, and improvements which will readily occur to those skilled in the art, as concerns its implementation and its applications. It may in particular be applied to integrated circuit structures. Further, it enables definition of an area perfectly delimited at the top and on the sides by dielectrics, and at the bottom by a potential barrier. The properties of this "box" and of the underlying monatomic interface are usable in many fields other than bipolar transistors. In particular, this principle may be applied to sensors, since the interface is very clean, to the manufacturing of fast diodes, to the modification of energy band structures in a limited field, by bringing down to a few nanometers the thickness of the upper layer deposition (15 or 35 in the above examples). By means of the present invention, supernetworks only made of silicon also become implementable.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of deposition of a silicon layer on a single-crystal silicon substrate, so that the silicon layer is a single-crystal layer, but of different orientation than the substrate, including the steps of:

defining a window on the substrate;

creating inside the window interstitial defects with an atomic proportion lower than one for one hundred; and performing a silicon deposition in conditions generally corresponding to those of an epitaxial deposition, but at a temperature lower than 750° C.

2. The method of claim 1, wherein the deposition temperature ranges between 600° C. and 700° C.

3. The method of claim 2, wherein the step of defect creation includes an implantation step.

4. The method of claim 3, wherein the implantation is performed through a silicon oxide layer of a thickness lower than 10 nm and wherein this implantation is followed by a step of removal of the silicon oxide layer.

5. The method of claim 3, wherein the implantation is an implantation of an electrically neutral element.

6. The method of claim 3, wherein the implantation is an implantation of an element selected from the group consisting of fluorine, silicon, germanium, boron, indium, phosphorus, arsenic, and antimony.

7. The method of claim 6, wherein the implantation of an electrically neutral element is a fluorine implantation at 12 keV, at $10^{13}$ at./cm$^2$.

8. The method of claim 1, wherein the window opening has a width lower than 5 μm.

9. The method of claim 8, wherein the width of the window opening is reduced by compound spacers.

10. The method of claim 9, wherein the compound spacers comprise silicon nitride regions, and polysilicon spacers.

* * * * *